United States Patent
Chen et al.

(10) Patent No.: US 10,074,584 B2
(45) Date of Patent: Sep. 11, 2018

(54) METHOD OF FORMING A SEMICONDUCTOR COMPONENT COMPRISING A SECOND PASSIVATION LAYER HAVING A FIRST OPENING EXPOSING A BOND PAD AND A PLURALITY OF SECOND OPENINGS EXPOSING A TOP SURFACE OF AN UNDERLYING FIRST PASSIVATION LAYER

(71) Applicant: Taiwan Semiconductor Manufacturing Company, Ltd., Hsin-Chu (TW)

(72) Inventors: Ying-Ju Chen, Yunlin County (TW); Hsien-Wei Chen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/821,576

(22) Filed: Aug. 7, 2015

(65) Prior Publication Data

US 2015/0348922 A1   Dec. 3, 2015

Related U.S. Application Data

(62) Division of application No. 12/909,458, filed on Oct. 21, 2010, now Pat. No. 9,105,588.

(51) Int. Cl.
*H01L 23/528* (2006.01)
*H01L 23/31* (2006.01)
(Continued)

(52) U.S. Cl.
CPC .... *H01L 23/3171* (2013.01); *H01L 21/76816* (2013.01); *H01L 21/76877* (2013.01); *H01L 23/3192* (2013.01); *H01L 23/562* (2013.01); *H01L 24/03* (2013.01); *H01L 24/11* (2013.01); *H01L 24/02* (2013.01); *H01L 24/05* (2013.01);
(Continued)

(58) Field of Classification Search
CPC .......... H01L 24/05; H01L 24/13; H01L 24/16
See application file for complete search history.

(56) References Cited

U.S. PATENT DOCUMENTS

| 6,077,726 | A | 6/2000 | Mistry et al. |
| 6,344,369 | B1 * | 2/2002 | Huang ............... H01L 24/11 |
| | | | 257/E21.508 |
| 6,664,142 | B2 | 12/2003 | Liu |
| 6,827,868 | B2 | 12/2004 | Daubenspeck et al. |

(Continued)

*Primary Examiner* — Anh D Mai
(74) *Attorney, Agent, or Firm* — Haynes and Boone, LLP

(57) ABSTRACT

A conductive feature on a semiconductor component is disclosed. A first passivation layer is formed over a substrate. A bond pad is formed over the first passivation layer. A second passivation layer overlies the first passivation layer and the bond pad. The second passivation layer has a first opening overlying the bond pad and a plurality of second openings exposing a top surface of the first passivation layer. A buffer layer overlies the second passivation layer and fills the plurality of second openings. The buffer layer has a third opening overlapping the first opening and together exposes a portion the bond pad. The combined first opening and third opening has sidewalls. An under bump metallurgy (UBM) layer overlies the sidewalls of the combined first opening and third opening, and contacts the exposed portion of the bond pad. A conductive feature overlies the UBM layer.

18 Claims, 9 Drawing Sheets

(51) Int. Cl.
*H01L 21/768* (2006.01)
*H01L 23/00* (2006.01)

(52) U.S. Cl.
CPC ........ *H01L 24/13* (2013.01); *H01L 2224/024* (2013.01); *H01L 2224/0239* (2013.01); *H01L 2224/02313* (2013.01); *H01L 2224/02331* (2013.01); *H01L 2224/0345* (2013.01); *H01L 2224/0382* (2013.01); *H01L 2224/03452* (2013.01); *H01L 2224/03462* (2013.01); *H01L 2224/03464* (2013.01); *H01L 2224/03614* (2013.01); *H01L 2224/03912* (2013.01); *H01L 2224/0401* (2013.01); *H01L 2224/05009* (2013.01); *H01L 2224/05025* (2013.01); *H01L 2224/0558* (2013.01); *H01L 2224/05082* (2013.01); *H01L 2224/05147* (2013.01); *H01L 2224/05166* (2013.01); *H01L 2224/05562* (2013.01); *H01L 2224/05655* (2013.01); *H01L 2224/1132* (2013.01); *H01L 2224/1145* (2013.01); *H01L 2224/1146* (2013.01); *H01L 2224/1147* (2013.01); *H01L 2224/11462* (2013.01); *H01L 2224/11849* (2013.01); *H01L 2224/13099* (2013.01); *H01L 2224/13147* (2013.01); *H01L 2924/01019* (2013.01); *H01L 2924/07025* (2013.01); *H01L 2924/10329* (2013.01); *H01L 2924/14* (2013.01)

(56) References Cited

U.S. PATENT DOCUMENTS

| | | | |
|---|---|---|---|
| 6,881,654 B2 | 4/2005 | Chen et al. | |
| 7,071,575 B2 | 7/2006 | Wu et al. | |
| 7,659,632 B2 | 2/2010 | Tsao et al. | |
| 8,072,076 B2 | 12/2011 | Hsu et al. | |
| 8,114,757 B1 | 2/2012 | Daupenspeck et al. | |
| 8,405,211 B2 | 3/2013 | Tsai et al. | |
| 8,659,170 B2 * | 2/2014 | Kuo | H01L 24/03 257/737 |
| 8,786,081 B2 * | 7/2014 | Chen | H01L 23/525 257/737 |
| 8,952,530 B2 * | 2/2015 | Chen | H01L 23/3192 257/633 |
| 2009/0283903 A1 * | 11/2009 | Park | H01L 24/03 257/737 |
| 2011/0241202 A1 * | 10/2011 | Liu | H01L 23/552 257/737 |
| 2011/0260317 A1 * | 10/2011 | Lu | H01L 24/11 257/737 |
| 2012/0018875 A1 * | 1/2012 | Yang | H01L 23/3171 257/737 |
| 2012/0040524 A1 * | 2/2012 | Kuo | H01L 24/11 438/614 |
| 2013/0256874 A1 * | 10/2013 | Lin | H01L 23/293 257/737 |
| 2014/0045326 A1 | 2/2014 | Liang et al. | |

* cited by examiner

METHOD OF FORMING A SEMICONDUCTOR COMPONENT COMPRISING A SECOND PASSIVATION LAYER HAVING A FIRST OPENING EXPOSING A BOND PAD AND A PLURALITY OF SECOND OPENINGS EXPOSING A TOP SURFACE OF AN UNDERLYING FIRST PASSIVATION LAYER

PRIORITY DATA

The present application is a divisional patent application of U.S. patent application Ser. No. 12/909,458, filed on Oct. 21, 2010, entitled "SEMICONDUCTOR COMPONENT HAVING A SECOND PASSIVATION LAYER HAVING A FIRST OPENING EXPOSING A BOND PAD AND A PLURALITY OF SECOND OPENINGS EXPOSING A TOP SURFACE OF AN UNDERLYING FIRST PASSIVATION LAYER", now U.S. Pat. No. 9,105,588, the disclosure of which is hereby incorporated by reference in its entirety.

TECHNICAL FIELD

The disclosure relates generally to semiconductor packaging processes, and more particularly, to a structure and methods for forming a conductive feature in a flip chip package.

BACKGROUND

Flip chip technology plays an important role in the packaging of semiconductor devices. A flip chip microelectronic assembly includes a direct electrical connection of face down electronic components onto substrates, such as circuit boards, using solder bumps as the interconnects. The use of flip chip packaging has dramatically grown as a result of the advantages in size, performance and flexibility flip chips have over other packaging methods.

However, the standard solder bump manufacture processes have a number of shortcomings. For example, the polyimide layer may peel during the process. Some contamination or moisture can penetrate through the die. Therefore, the failure rate of the overall assembly could increase.

Accordingly, there is a need for an improved structure and method to form a conductive feature for a semiconductor wafer with robust electrical performance.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

FIGS. 1 to 7 are planar views and cross-sectional views showing various stages during fabrication of a structure according to one or more embodiments of this invention. The term "substrate" as described herein, refers to a semiconductor substrate on which various layers and integrated circuit components are formed. The substrate, in some embodiments, includes silicon or a compound semiconductor, such as GaAs, InP, Si/Ge, or SiC. Examples of layers include dielectric layers, doped layers, metal layers, polysilicon layers and via plugs that connect one layer to one or more layers. Examples of integrated circuit components include transistors, resistors, and/or capacitors. The substrate includes a plurality of semiconductor dies fabricated on a surface of the substrate, wherein each die comprises one or more integrated circuits. The plurality of semiconductor dies is divided by scribe lines (not shown) between each die. The following process steps will be performed on the plurality of semiconductor dies on the surface of the substrate.

Figure 1:
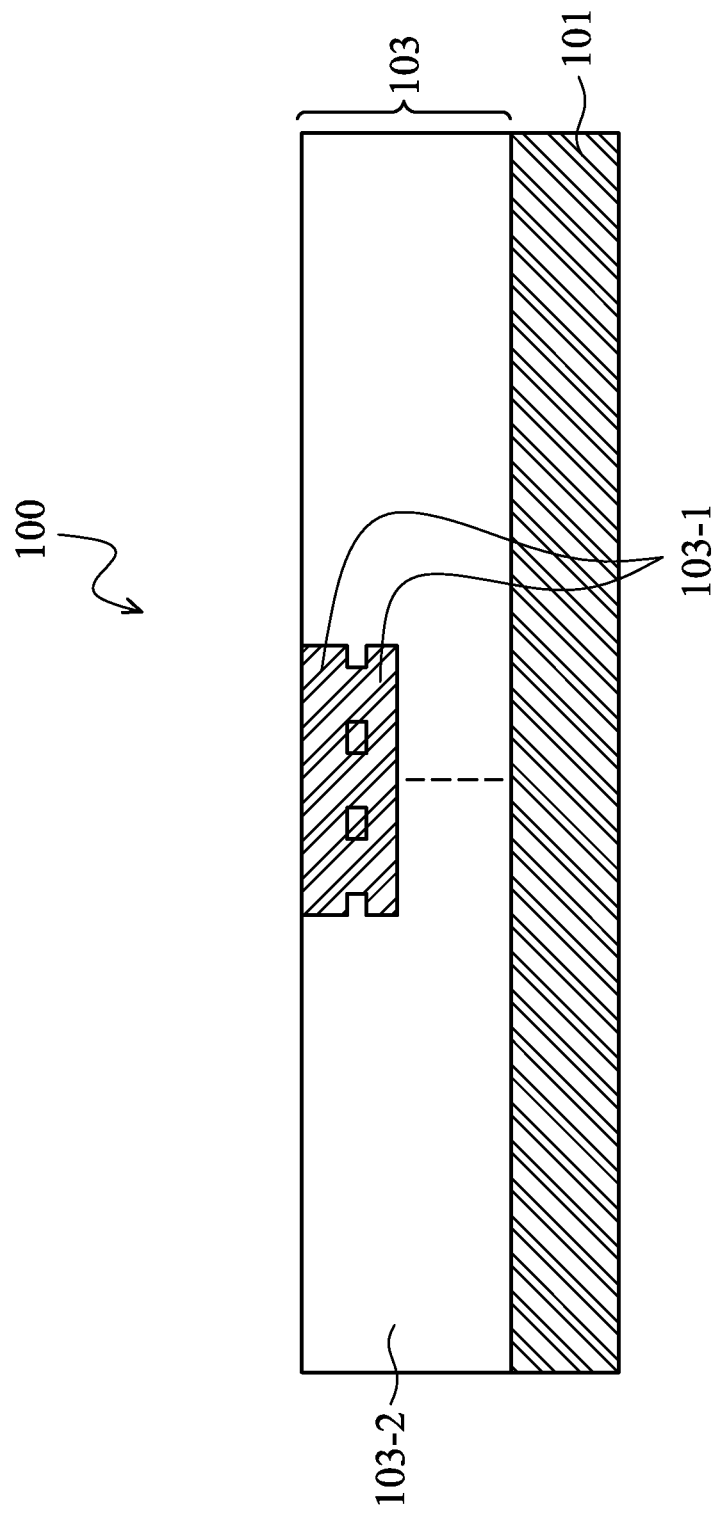
FIGS. 1 to 7 are planar views and cross-sectional views showing various stages during fabrication of a structure according to one or more embodiments.

Referring to FIG. 1, a semiconductor component 100 is formed on a substrate 101. The substrate 101 with a plurality of semiconductor dies (not shown) on the surface is provided. The portion of the substrate 101 in FIG. 1 contains only a portion of one of the plurality of dies. A plurality of interconnect layers 103 are formed on the surface of the substrate 101. The interconnect layers 103 include one or more conductive layers 103-1 disposed within one or more dielectric layers 103-2. The conductive layers 103-1 electrically connect integrated circuit components, and provide electrical connections from the integrated circuits to the upper layers. In some embodiment, the dielectric layer 103-2 in the interconnect layers 103 is formed of low-k dielectric materials with dielectric constants (k value) between about 2.9 and 3.8, ultra low-k (ULK) dielectric materials with k values between about 2.5 and about 2.9, or some combination of low-k dielectric materials. Typically the lower k value a dielectric layer 103-2 has, the more fragile and prone to delamination and cracking the layer becomes.

Figure 2:
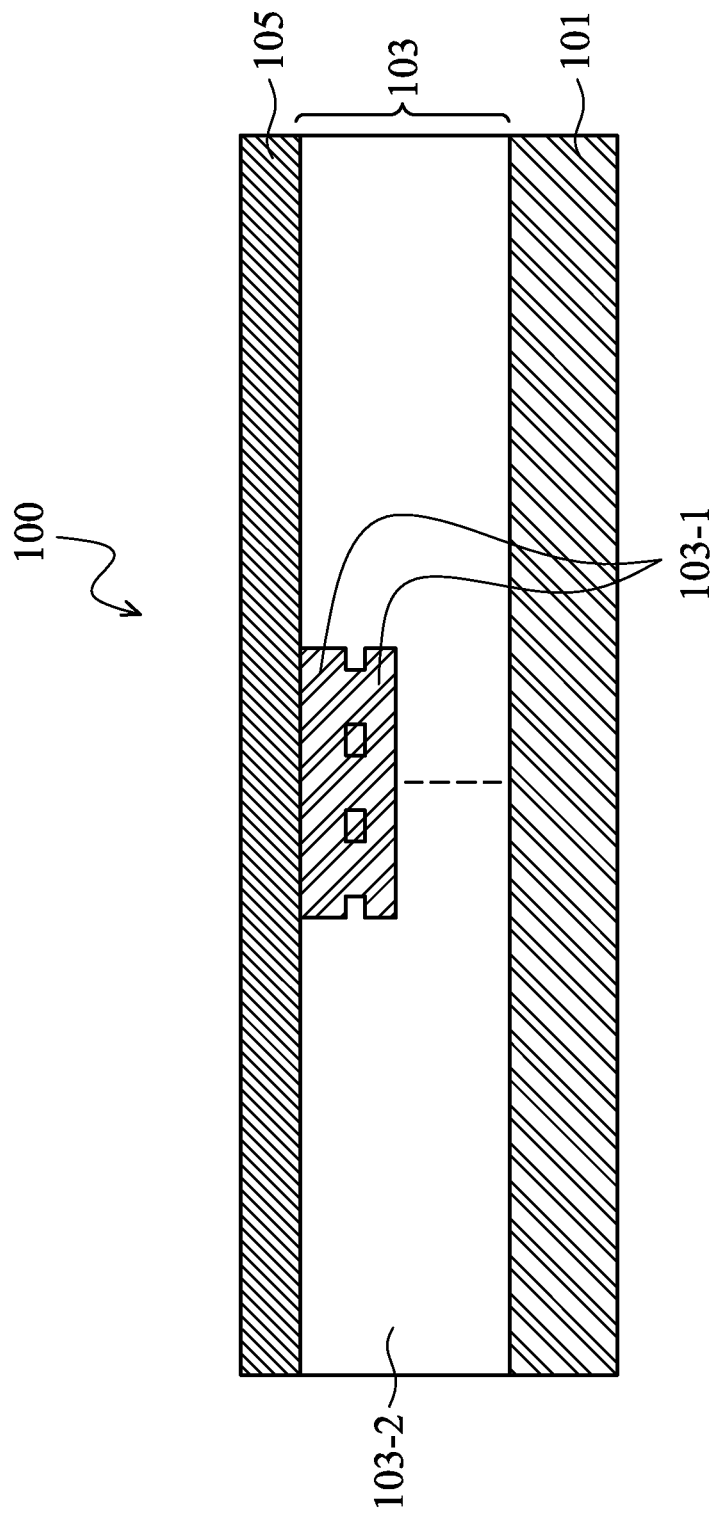

Referring to FIG. 2, a first passivation layer 105 is formed over the interconnect layers 103 to protect the integrated circuits and interconnect layers 103 from damage and contamination. In some embodiments, the first passivation layer 105 includes one or more layers, such as oxide, undoped silicate glass (USG), silicon nitride (SiN), silicon dioxide ($SiO_2$) or silicon oxynitride (SiON). The first passivation layer 105 prevents or decreases moisture, mechanical, and radiation damage to the integrated circuits.

Figure 3:
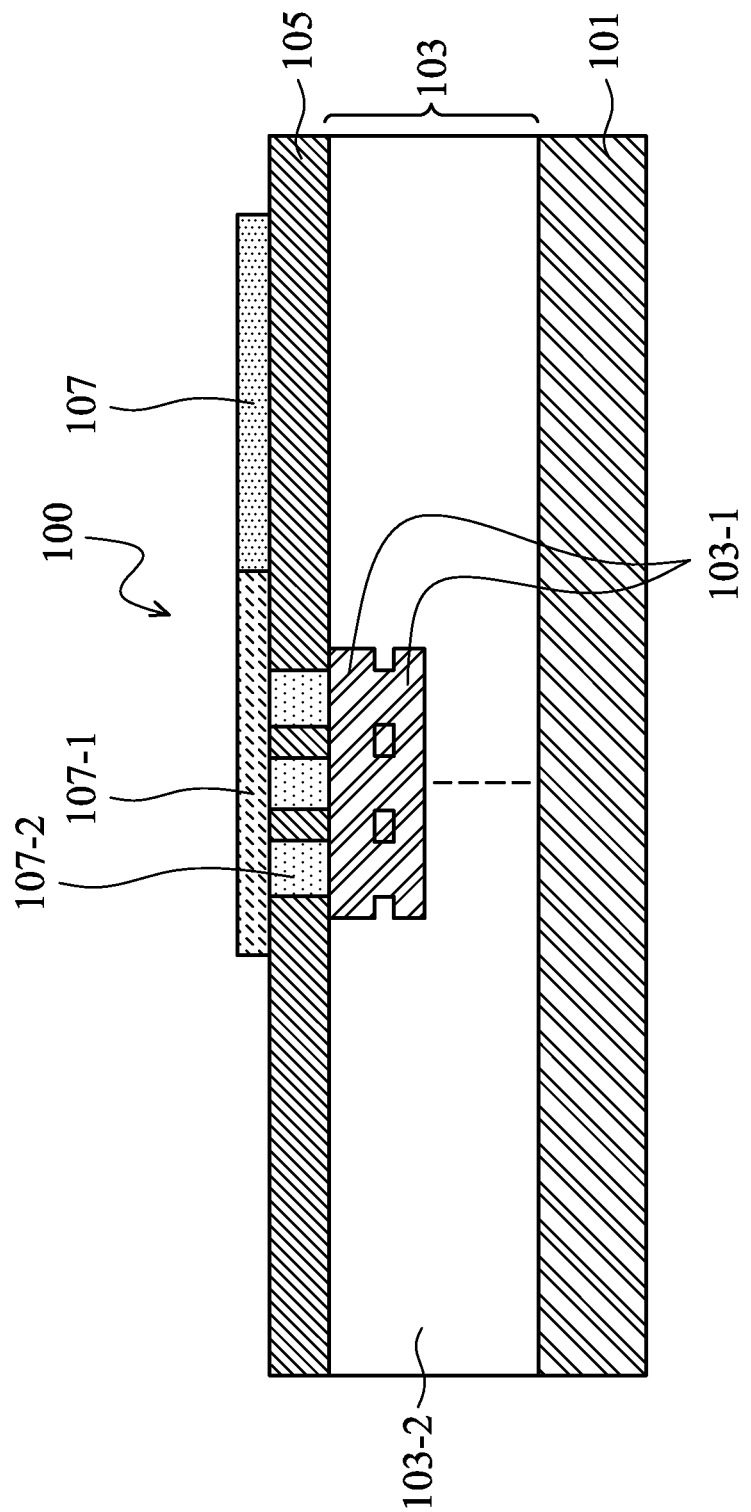

Referring to FIG. 3, a bond pad 107 is formed over the first passivation layer 105. A conductive interconnect 107-1 is also formed in a same layer of the bond pad 107 and contacts the bond pad 107. The bond pad 107 provides electrical connection between the overlying solder bumps and the underlying integrated circuits through the conductive interconnect 107-1. The conductive interconnect 107-1 connects the bond pad 107 to metal vias 107-2. Through the metal vias 107-2 to the conductive layer 103-1 in the interconnect layers 103, an electrical connection loop to the underlying integrated circuits is completed. In one embodiment, the bond pad 107 and the conductive interconnect 107-1 include an electrically conductive material such as aluminum, aluminum alloy, copper, copper alloy, or combinations thereof. In some embodiment, the bond pad 107 and the conductive interconnect 107-1 are deposited by physical vapor deposition (PVD) such as a sputtering deposition using a sputtering target made of aluminum, copper or an alloy thereof, followed by patterning the deposited layer with photolithography and etching.

Figure 4A:
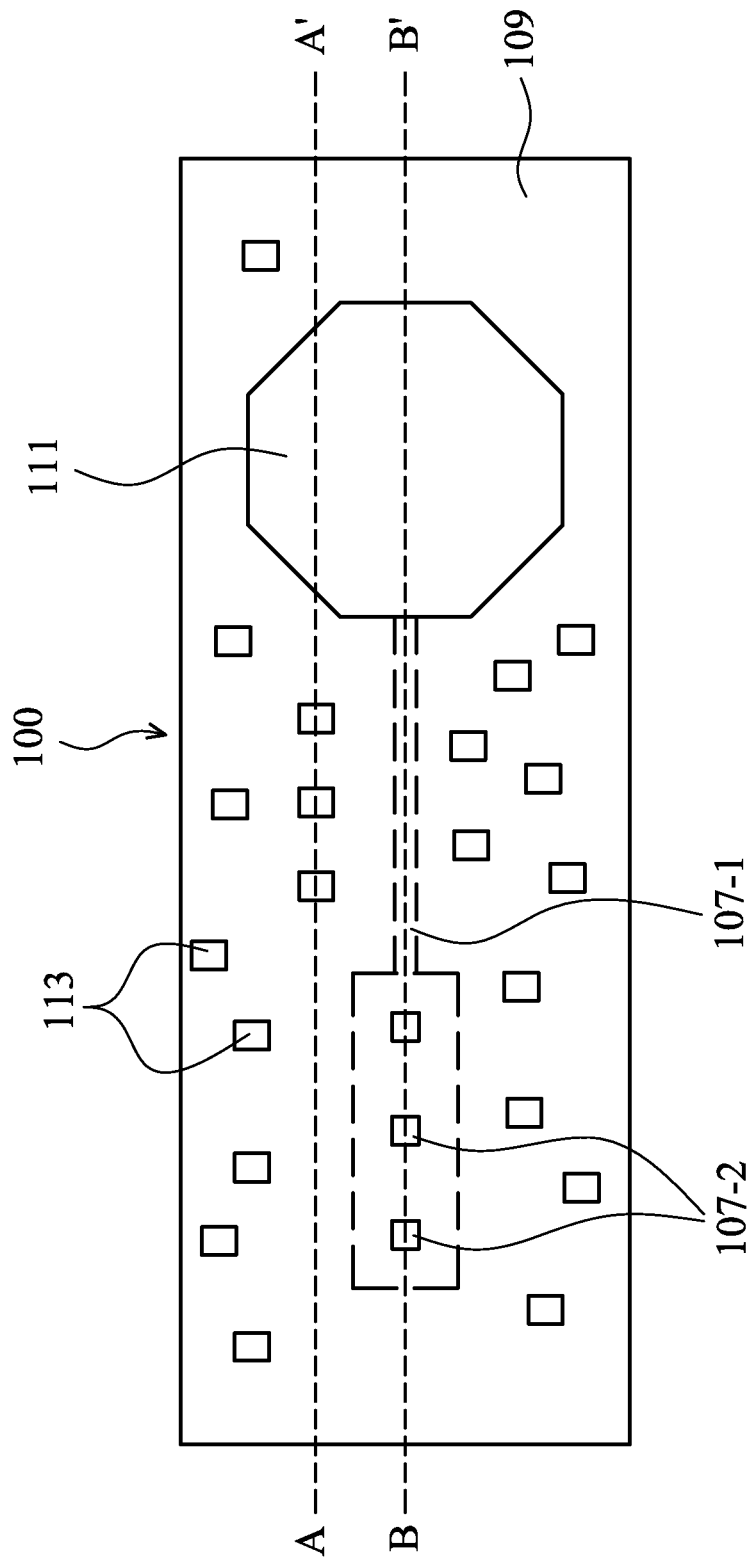

Next, as shown in FIG. 4A, a second passivation layer 109 is formed over the first passivation layer 105, the bond pad 107 and the conductive interconnect 107-1. The second passivation layer 109 absorbs or releases thermal or mechanical stress caused by packaging of the substrate. In one embodiment, the second passivation layer 109 may be formed in a similar fashion and from similar materials to the first passivation layer 105. Alternatively, the first passivation layer 105 and second passivation layer 109 may be formed from different materials. The second passivation layer 109 may be deposited over the first passivation layer 105, the bond pad 107 and the conductive interconnect 107-1 by conventional deposition techniques, such as chemical vapor deposition (CVD). Photolithography and etching follow the deposition to selectively pattern a first opening 111 and a plurality of second openings 113 in the second passivation layer 109.

Figure 4B:
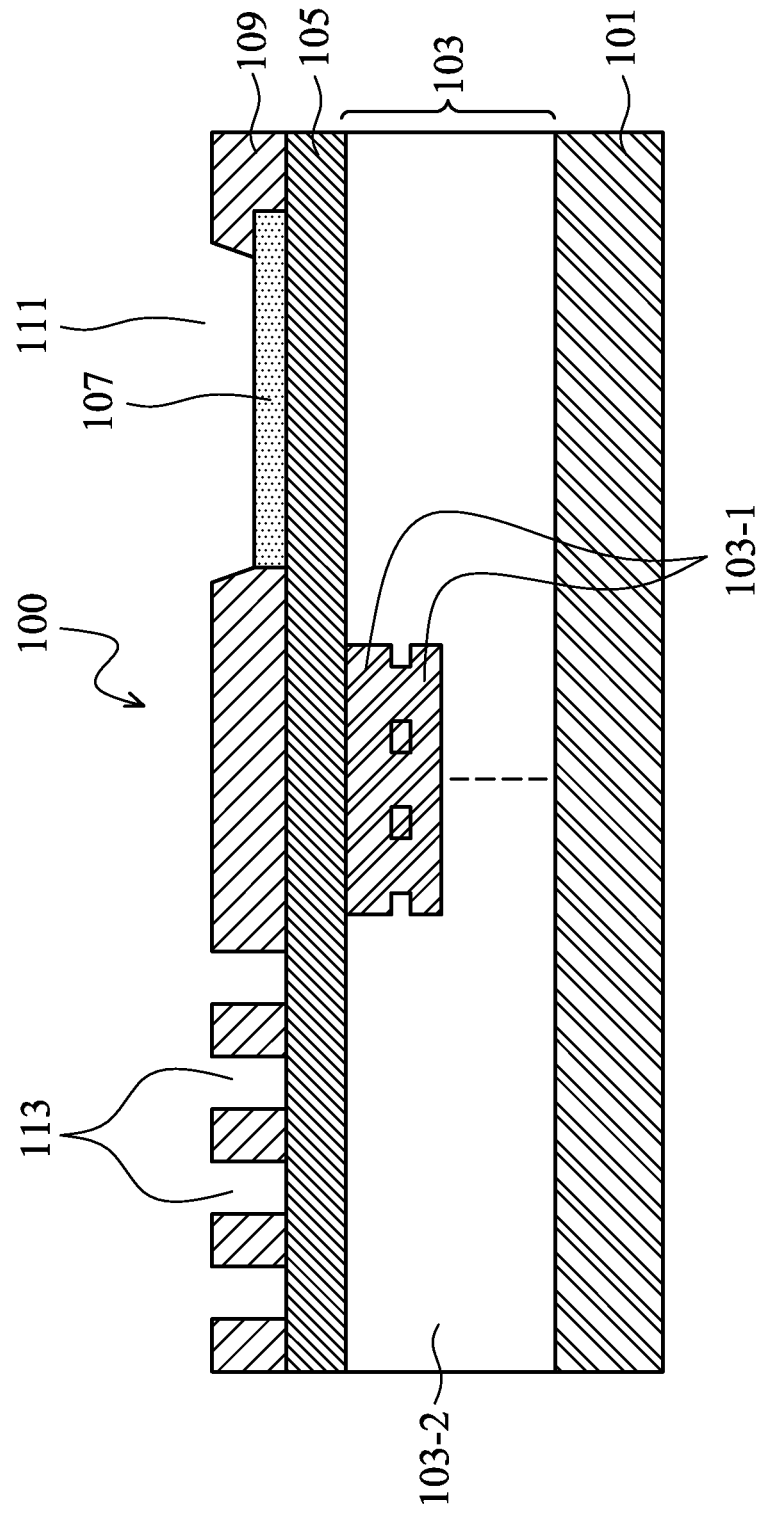

FIG. 4A shows a planar view of the second passivation layer 109, the first opening 111, and the plurality of second openings 113. In FIG. 4A, the conductive interconnect 107-1 is illustrated by a dashed line, which means the conductive interconnect 107-1 is covered by the second passivation layer 109. FIG. 4B is a cross-sectional view obtained from the vertical plane crossing line A-A' in FIG. 4A. As shown in FIG. 4A and FIG. 4B, the first opening 111 overlies the bond pad 107 and leaves a surface of the bond pad 107 in the first opening 111 exposed. The plurality of second openings 113 expose a portion of a top surface of the underlying first passivation layer 105. In one embodiment, an exposing ratio of the plurality of second openings 113 in the second passivation layer 109 is between about 0.2 to about 0.8. The exposing ratio is defined as a total open area of the second openings 113 within a certain area of the second passivation layer 109. An aspect ratio of the plurality of the second openings 113 is between 0.5 to about 1.9. The aspect ratio is defined as the opening height divided by the opening width. In one embodiment, the second openings 113 are in a random arrangement. The plurality of second openings 113 is patterned to increase the upper surface between layers. In this manner, the upper surface alternates between the second passivation layer 109, the second openings 113 and the first passivation layer 105, thereby a zigzag pattern in the upper surface is formed. The zigzag pattern helps to increase the adhesion of the buffer layer in a process described below. Further, by patterning the second passivation layer 109, no additional process steps are required, thereby giving a benefit without a substantial process cost.

Figure 4C:
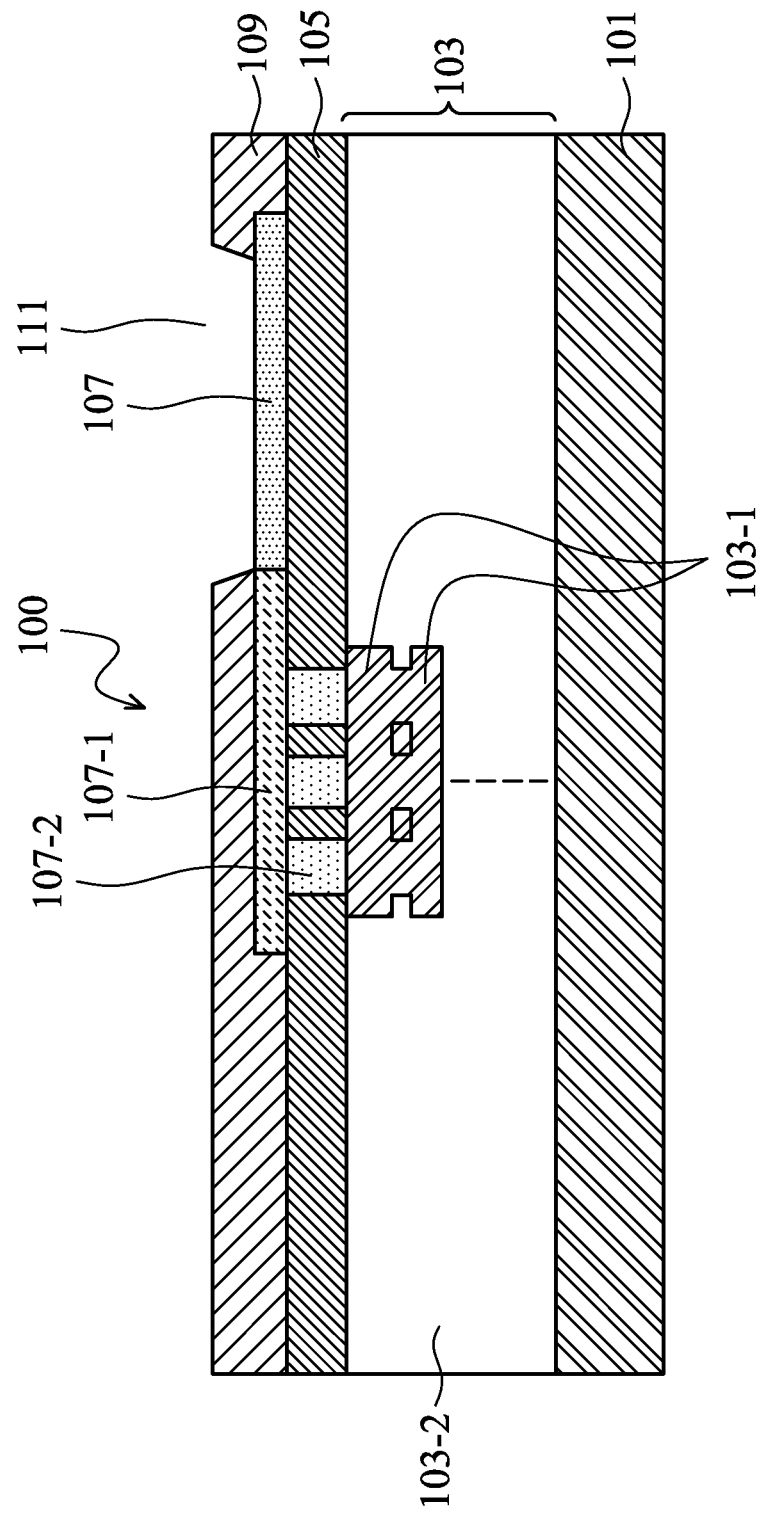

FIG. 4C is a cross-sectional view obtained from the vertical plane crossing line B-B' in FIG. 4A. As shown in FIG. 4C, the second openings 113 do not overlie the conductive interconnect 107-1 or other metal features. In this manner, the conductive interconnect 107-1 or other metal features are not exposed by second openings 113, and are still protected by the second passivation layer 109 and above layers from damage and contamination.

Figure 5:
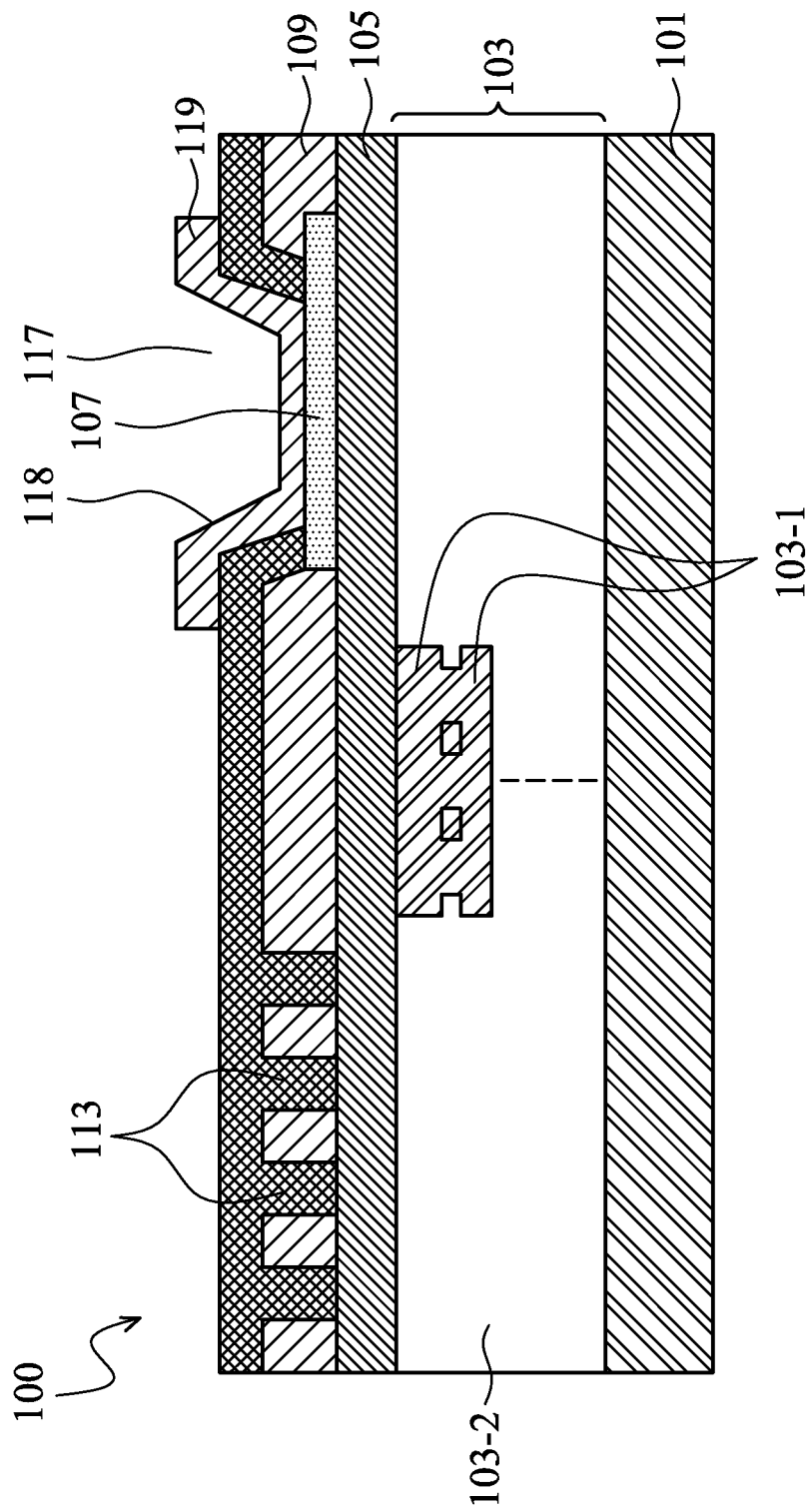

Referring to FIG. 5, a buffer layer 115 is formed over the second passivation layer 109 and the bond pad 107 after the process shown in FIG. 4B. The buffer layer 115 includes polyimide, polybenzobisoxazole (PBO), or epoxy, with a thickness of between about 2 μm and about 10 μm. The buffer layer 115 coats the second passivation layer 109 and fills into the first opening 111 and the second openings 113 to cover the exposed surf ace of the bond pad 107 and the first passivation layer 105. The buffer layer 115 serves as a stress buffer to reduce the stress transfer to the first passivation layer 105 and the second passivation layer 109 during assembly process. Photolithography and patterning follow to selectively pattern a third opening 117 in the buffer layer 115. The third opening 117 overlaps the first opening 111 in the second passivation layer 109 and together exposes a portion of the top surface of the bond pad 107. The combined first opening 111 and the third opening 117 has sidewalls 118.

Figure 6:
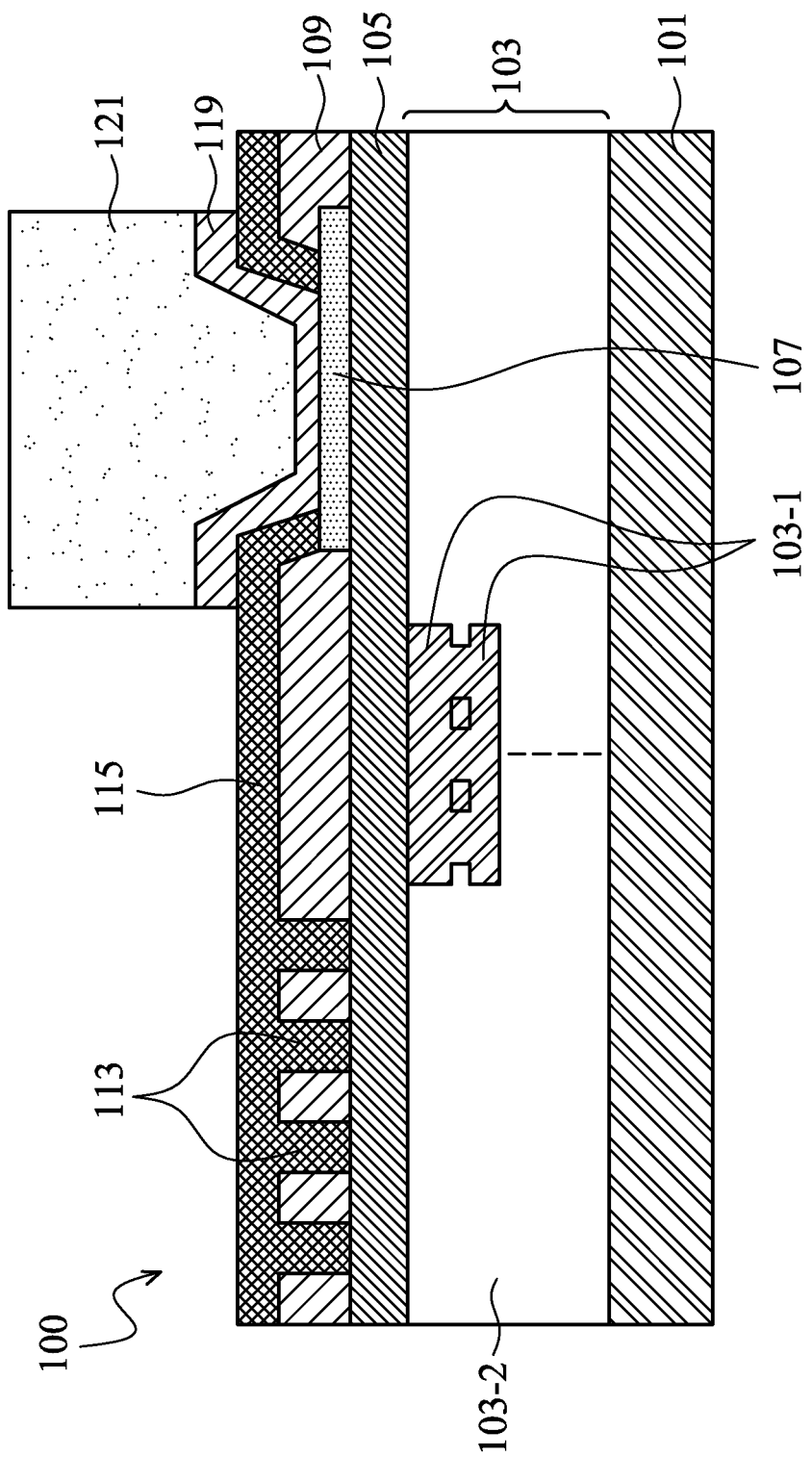

Referring to FIG. 6, an under bump metallurgy (UBM) layer 119 is formed over a portion of buffer layer 115, lines the sidewalls 118 of the combined first opening 111 and third opening 117, and contacts the exposed portion of the bond pad 107. In some embodiments, the UBM layer 119 includes multiple layers of conductive materials, such as a layer of titanium, a layer of copper, and a layer of nickel. Each layer in the UBM layer 119 is preferably formed using a plating process, such as electrochemical plating, although other processes of formation, such as sputtering, evaporation, electroless plating or PECVD process, may alternatively be used depending upon the desired materials.

Next, a photoresist layer (not shown) is formed over the UBM layer 119 and developed to form a hole that exposes the UBM layer 119 in the combined first opening 111 and third opening 117, and over a portion of the buffer layer 115. The photoresist layer acts as a mold for metal deposition processes for conductive feature formation. In some embodiments, a conductive material is deposited in the hole by evaporation, electroplating, or screen printing to form a conductive column 121 over the UBM layer 119 as shown in FIG. 6. The conductive material includes any of a variety of metals, metal alloys or metals and mixture of other materials and the conductive material includes solder and copper.

After the removal of the photoresist layer, the UBM layer 119 not covered by the conductive feature 121 is removed by a reactive ion etch (RIE) process that etches the exposed portions of the UBM layer 119 down to the underlying buffer layer 115. The remaining UBM layer 119 under the conductive column 121 is disposed over the sidewalls 118 of the combined first opening 111 and third opening 117, and is also over the top portion of the buffer layer 115, and contacts the exposed portion of the bond pad 107. In one embodiment, the conductive column 121 is a copper pillar. In another embodiment, the conductive feature 121 is a solder, wherein the solder is reflown by heating to form a solder bump.

Figure 7:
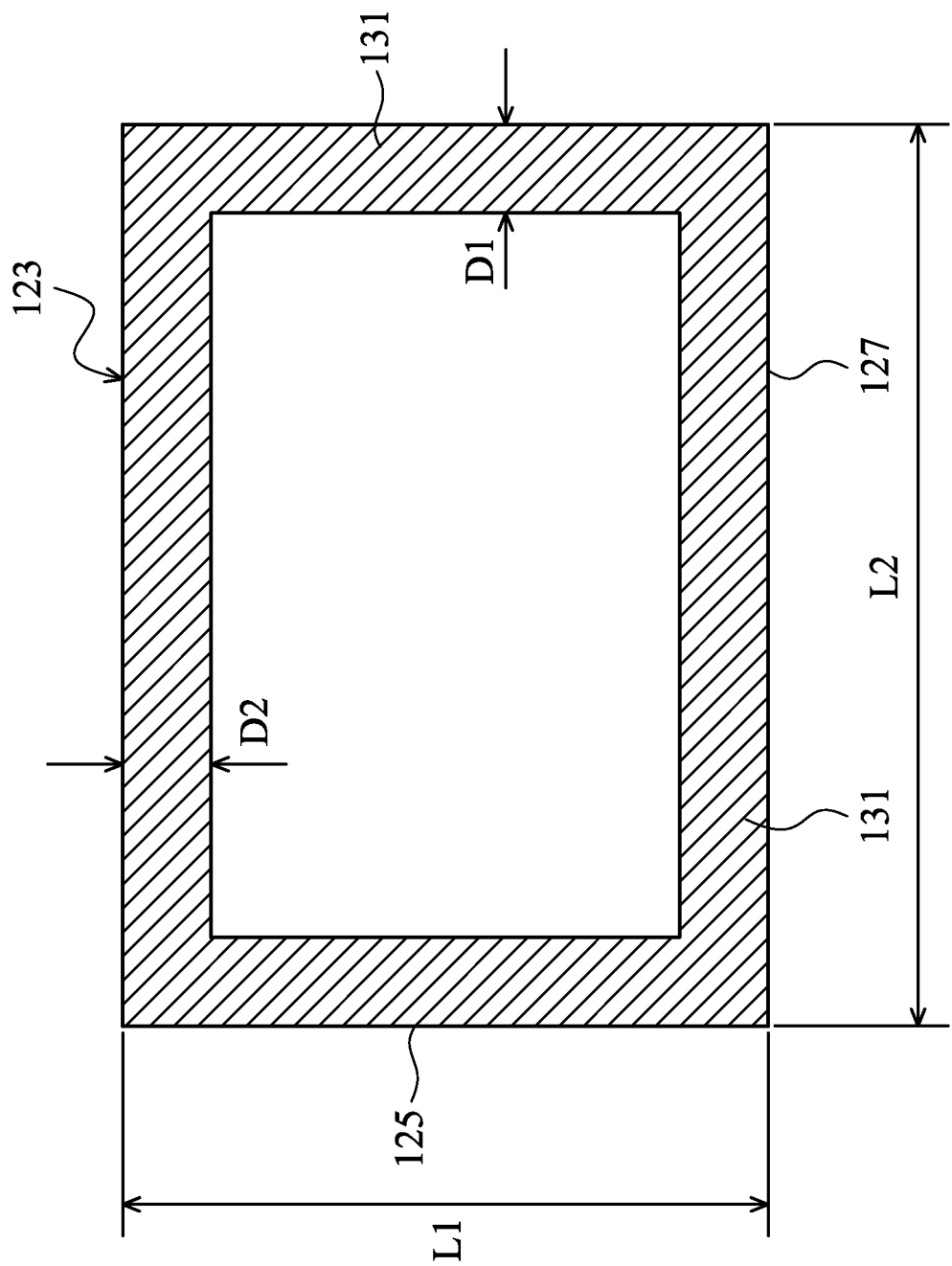

FIG. 7 depicts a planar view of an example layout of the second openings 113 formed in the buffer layer 115 of the semiconductor component 100 in accordance with embodiments of the disclosure. The cross-section of the second openings 113 may be various shapes, for example a circle, a square or a rectangle. The semiconductor component 100 is on a rectangular die 123. The rectangular die 123 has edges 125 and 127, having lengths L1 and L2, respectively. According to some embodiments, a restriction region 131 is defined to contain the plurality of second openings 113 to improve the adhesion of the buffer layer 115 and the underlying layers around the edge of the die 123. The buffer layer 115 is prevented from shrinkage stress induced by a polyimide curing process. The restriction region 131 is defined from the edge of the rectangular die 123 inwards and may include the entire periphery of the rectangular die 123, as shown in FIG. 7. The restriction region 131 has a width D1 on the L1 edges and a width D2 on the L2 edges such that the widths D1 and D2 are less than one tenth of the lengths L1 and L2. In other embodiments, the second openings 113 are not limited to the restriction region 131.

Various embodiments of the present disclosure may be used to moderate the shortcomings of the previous solder bump manufacturing processes. For example, in the various embodiments the second openings 113 formed in the second passivation layer 109 protects the buffer layer 115 from peeling in package processes. A proper range for the exposing ratio will improve the acceptable yield during assembly.

Although exemplary embodiments and the respective advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of semiconductor component fabrication, comprising:
   depositing a first passivation layer over a substrate;
   forming a bond pad overlying the first passivation layer;
   depositing a second passivation layer overlying the first passivation layer and the bond pad;
   patterning the second passivation layer, by a lithography and etching process, to include a first opening and a plurality of second openings forming a plurality of solid-passivation features between the second openings, wherein forming the first opening and the plurality of second openings provides an exposing ratio, the exposing ratio defined as a total open area of the plurality of second openings within a specified region of the second passivation layer to a total area of the specified region of the second passivation layer, the defined exposing ratio being about 0.8, wherein the first opening overlies the bond pad, wherein a bottom surface of each of the plurality of second openings is defined by a top surface of the first passivation layer, and wherein each second opening of the plurality of second openings is spaced from the first opening and from a conductive interconnect;
   forming a conductive interconnect line underlying the second passivation layer, wherein the conductive interconnect line extends laterally away from the bond pad to a plurality of conductive vias disposed a distance from the bond, wherein the conductive interconnect line is disposed along a vertical plane extending between the bond pad and the plurality of conductive vias, and wherein each second opening of the plurality of second openings is disposed on a lateral side of the vertical plane extending between the bond pad and the plurality of conductive vias;
   fabricating a buffer layer overlying the second passivation layer and filling the plurality of second openings, wherein the buffer layer includes a third opening overlapping the first opening and is smaller than the first opening, wherein the third opening exposes a portion of the bond pad, and wherein the third opening has sidewalls; and
   forming a conductive feature overlying the portion of the bond pad.

2. The method of claim 1, wherein the first passivation layer comprises a different material than the second passivation layer.

3. The method of claim 1, wherein the forming the conductive interconnect line includes forming the conductive interconnect line to electrically connect the bond pad to the conductive vias.

4. The method of claim 1, further comprising:
   forming an under bump metallurgy (UBM) layer between the conductive feature and the bond pad, wherein the UBM layer includes multiple layers of conductive material.

5. The method of claim 1, wherein the second passivation layer interposing a first opening and a second opening of the plurality of second openings includes a dielectric interface with the first passivation layer, and wherein the dielectric interface extends from the first opening to the second opening.

6. A method of semiconductor component fabrication, comprising:
   depositing a first passivation layer over a substrate;
   forming a bond pad overlying the first passivation layer;
   depositing a second passivation layer overlying the first passivation layer and the bond pad;
   patterning the second passivation layer, by a photolithography and etching process, to form a first opening and a plurality of second openings to provide an exposing ratio, the exposing ratio defined as a total open area of the plurality of second openings within a specified region of the second passivation layer to a total area of the specified region of the second passivation layer, the defined exposing ratio being about 0.8, wherein the first opening overlies the bond pad, wherein the plurality of the second openings exposes a top surface of the first passivation layer, wherein each second opening of the plurality of second openings is spaced from the first opening and from a conductive interconnect connected to the bond pad, and wherein a region of the second passivation layer disposed between a first opening and a second opening of the plurality of second openings has a contiguous dielectric composition interfacing the first passivation layer and extending from the first opening to the second opening;
   forming a stress-reducing buffer layer overlying the second passivation layer and filling the plurality of second openings, wherein the stress-reducing buffer layer is prevented from peeling, at least in part, by the patterning of the second passivation layer to provide the exposing ratio within the selected range, wherein the stress-reducing buffer layer includes a third opening overlapping the first opening, and wherein the combined first opening and third opening together expose a portion of the bond pad, and wherein the combined first opening and third opening has sidewalls; and
   forming a conductive feature overlying the portion of the bond pad;
   wherein the plurality of second openings are of a size such that the stress-reducing buffer layer fills the second openings and has a relatively planar surface above the second openings.

7. The method of claim 6, further comprising:
   forming at least one conductive interconnect underlying the second passivation layer, wherein the at least one conductive interconnect is connected to the bond pad and extends laterally away from the bond pad to a plurality of conductive vias disposed a distance from the bond pad, and wherein a first group of the plurality of second openings surrounds the conductive interconnect and plurality of conductive vias.

8. The method of claim 6, wherein the size of each second opening is defined by an aspect ratio between about 0.5 to about 1.9.

9. The method of claim 6, wherein the patterning the second passivation layer further comprises patterning the plurality of second openings in a random arrangement.

10. The method of claim 6, wherein the forming the conductive feature includes forming a solder bump or a copper pillar overlying the portion of the bond pad.

11. The method of claim 6, wherein the forming the stress-reducing buffer layer overlying the second passivation layer includes forming a polyimide layer overlying the second passivation layer.

12. The method of claim 6, further comprising:
forming an under bump metallurgy (UBM) layer between the conductive feature and the bond pad.

13. The method of claim 12, wherein the forming the UBM layer includes forming the UBM layer having multiple layers of conductive material.

14. The method of claim 6, wherein the first passivation layer comprises a different material than the second passivation layer.

15. A method, comprising:
depositing a low-k dielectric layer over a substrate;
forming a bond pad over the low-k dielectric layer;
depositing a first passivation layer over the low-k dielectric layer;
forming a second passivation layer over the bond pad, the low-k dielectric layer, and the first passivation layer;
patterning the second passivation layer, by a photolithography and etching process, to include a first opening and a plurality of second openings each on a same side of the first opening with respect to the first opening, wherein forming the first opening and the plurality of second openings provides an exposing ratio, the exposing ratio defined as a total open area of the plurality of second openings within a specified region of the second passivation layer to a total area of the specified region of the second passivation layer, the defined exposing ratio being about 0.8, wherein the first opening overlies the bond pad, the plurality of second openings exposes a top surface of the first passivation layer, and wherein each second opening of the plurality of second openings is spaced from the first opening and from a conductive interconnect connected to the bond pad positioned;

fabricating a polyimide layer overlying the second passivation layer and filling the second openings, wherein the polyimide layer includes a third opening, and wherein the first opening and the third opening form a combined opening having sidewalls to expose a portion of the bond pad;

forming a conductive feature overlying the portion of the bond pad; and fabricating a conductive interconnect underlying the second passivation layer, the conductive interconnect connecting to the bond pad and extending laterally away from the bond pad to a plurality of conductive vias disposed a distance from the bond pad, wherein the conductive interconnect is disposed along a vertical plane that extends between the bond pad and the plurality of conductive vias, and wherein each second opening of the plurality of second openings is disposed on a lateral side of the vertical plane that extends between the bond pad and the plurality of conductive vias;

wherein the patterning the second passivation layer further includes patterning the second passivation layer to define an aspect ratio of the plurality of second openings to be between about 0.5 and 1.9.

16. The method of claim 15, wherein the patterning the second passivation layer further includes patterning the plurality of second openings in a random arrangement.

17. The method of claim 15, further comprising:
forming an interconnect layer within the low-k dielectric layer, wherein the conductive feature is electrically connected to the interconnect layer through the bond pad and the conductive interconnect.

18. The method of claim 15, wherein the forming the conductive feature includes forming a solder bump or a copper pillar.

* * * * *